United States Patent
Suzuki

(10) Patent No.: US 7,235,998 B1
(45) Date of Patent: Jun. 26, 2007

(54) SYSTEM AND METHOD FOR MEASURING TIME DEPENDENT DIELECTRIC BREAKDOWN WITH A RING OSCILLATOR

(75) Inventor: Shingo Suzuki, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/269,989

(22) Filed: Nov. 8, 2005

Related U.S. Application Data

(60) Division of application No. 10/870,752, filed on Jun. 16, 2004, now Pat. No. 7,126,365, which is a continuation-in-part of application No. 10/712,847, filed on Nov. 12, 2003, now Pat. No. 6,903,564, which is a continuation-in-part of application No. 10/672,793, filed on Sep. 26, 2003, now Pat. No. 6,885,210, which is a continuation-in-part of application No. 10/124,152, filed on Apr. 16, 2002, now Pat. No. 6,882,172.

(51) Int. Cl.
*G01R 31/26* (2006.01)
(52) U.S. Cl. .................................................. 324/769
(58) Field of Classification Search .................... None
See application file for complete search history.

(56) References Cited

U.S. PATENT DOCUMENTS

| | | | | |
|---|---|---|---|---|
| 6,455,901 | B2* | 9/2002 | Kameyama et al. | 257/371 |
| 6,476,632 | B1 | 11/2002 | La Rosa et al. | 324/769 |
| 6,882,172 | B1* | 4/2005 | Suzuki et al. | 324/769 |
| 6,885,210 | B1* | 4/2005 | Suzuki | 324/763 |
| 6,903,564 | B1* | 6/2005 | Suzuki | 324/763 |
| 2001/0052623 | A1* | 12/2001 | Kameyama et al. | 257/369 |
| 2004/0104731 | A1 | 6/2004 | Vollersten et al. | 324/551 |
| 2005/0212547 | A1* | 9/2005 | Suzuki | 324/769 |

FOREIGN PATENT DOCUMENTS

| | | | |
|---|---|---|---|
| EP | 1398639 | 3/2004 | 31/316 |

OTHER PUBLICATIONS

Oner et al. "A compact monitoring circuit for real-time on-chip diagnosis of hot-carrier induced degradation" Microelectronic test structures, 1997.

* cited by examiner

*Primary Examiner*—Jermele Hollington

(57) ABSTRACT

An integrated circuit, in accordance with one embodiment of the present invention, includes a first device under test (DUT) module coupled to a first ring oscillator module and a second DUT module coupled to a second ring oscillator module. A dielectric layer of the first DUT is stressed during a first mode, thereby causing time dependent dielectric breakdown in the first dielectric layer. A dielectric layer of the second DUT is maintained as a reference. The operating frequency of the first ring oscillator module, during a second mode, is a function of a gate leakage current of the stressed dielectric layer. The operating frequency of the second ring oscillator module, during the second mode, is a function of a gate leakage current the reference dielectric layer. The integrated circuit may also include a comparator module for generating an output signal as a function of a difference between the operating frequency of the first and second ring oscillator modules.

7 Claims, 4 Drawing Sheets

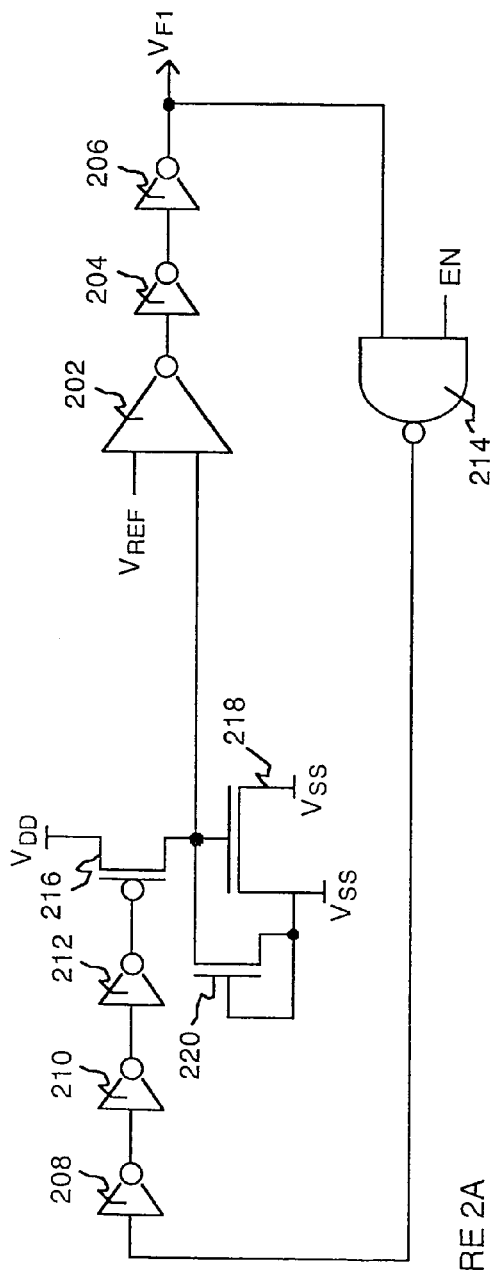
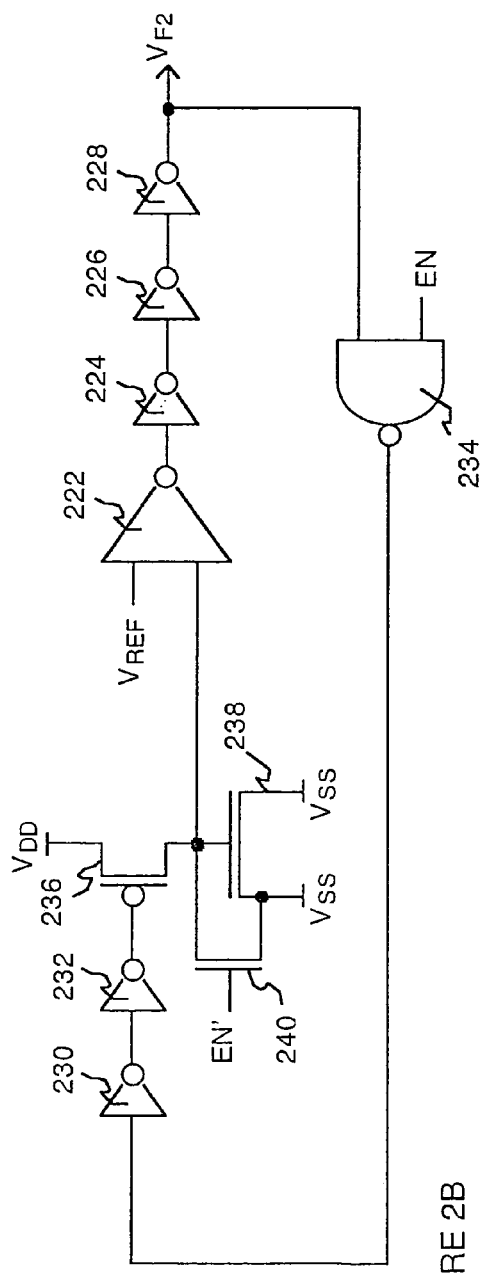
FIGURE 2A
FIGURE 2B

SYSTEM AND METHOD FOR MEASURING TIME DEPENDENT DIELECTRIC BREAKDOWN WITH A RING OSCILLATOR

CROSS-REFERENCE TO RELATED APPLICATIONS

This patent application is a Division of co-pending, commonly-owned patent application Ser. No. 10/870,752, filed on Jun. 16, 2004 now U.S. Pat. No. 7,126,365, entitled "SYSTEM AND METHOD FOR MEASURING TIME DEPENDENT DIELECTRIC BREAKDOWN WITH A RING OSCILLATOR", by Shingo Suzuki, which was a continuation-in-part of Ser. No. 10/712,847 now U.S. Pat. No. 6,903,564, filed Nov. 12, 2003, by Shingo Suzuki, entitled "A device Age Determination Circuit," Ser. No. 10/672,793 now U.S. Pat. No. 6,885,210, filed Sep. 26, 2003, by Shingo Suzuki, entitled "System and Method for Measuring Transistor Leakage Current with a Ring Oscillator with Backbias Controls," and Ser. No. 10/124,152 now U.S. Pat. No. 6,882,172, filed Apr. 16, 2002, by Shingo Suzuki et al., entitled "A system and Method for Measuring Transistor Leakage Current with a Ring Oscillator," which is incorporated herein by reference.

BACKGROUND OF THE INVENTION

Conventional integrated circuits suffer from various reliability and performance issues. For deep submicron (DSM) designs, issues such as hot carrier injection (HCI), time dependant dielectric breakdown (TDDB), negative bias thermal instability (NBTI) and the like, increasingly affect performance of integrated circuits.

In order to increase the performance and reliability of an integrated circuit various operating parameters, such as the supply voltage, operating frequency, back bias (e.g., threshold voltage), and/or the like, may be adjusted. However, there is typically a tradeoff between performance and lifetime of the integrated circuit. Adjusting the operating parameters to achieve increased performance typically results in an increase in stresses, such as time dependent dielectric breakdown (TDDB). The tradeoff between performance and lifetime may be more accurately balanced if TDDB in the integrated circuit can be measured.

SUMMARY OF THE INVENTION

Accordingly, embodiments of the present invention are directed toward a method and system for measuring time dependent dielectric breakdown (TDDB) in an integrated circuit, electronic device or the like. In one embodiment, an integrated circuit includes a first device under test (DUT) module coupled to a first ring oscillator module and a second DUT module coupled to a second ring oscillator module. A dielectric layer of the first DUT is stressed during a first mode, thereby causing time dependent dielectric breakdown in the first dielectric layer. A dielectric layer of the second DUT is maintained as a reference. The operating frequency of the first ring oscillator module, during a second mode, is a function of a gate leakage current of the stressed dielectric layer. The operating frequency of the second ring oscillator module, during the second mode, is a function of a gate leakage current of the reference dielectric layer. The integrated circuit may also include a comparator module for generating an output signal as a function of a difference between the operating frequency of the first and second ring oscillator modules.

In another embodiment of the present invention, a method of measuring time dependent dielectric breakdown includes stressing a first dielectric layer of a first DUT module during a normal operating mode. A second dielectric layer of a second DUT module is maintained as a reference during the normal operating mode. The first dielectric layer is coupled as a first gate leakage source to a first ring oscillator module during a test mode. The second dielectric layer is coupled as a second gate leakage source to a second ring oscillator module during the test mode. An output signal is generated as a function of a difference between the operating frequencies of the first and second ring oscillator modules during the test mode.

In yet another embodiment, a system for measuring time dependent dielectric breakdown includes a differential amplifier, an enable switch, a set of inverters and a MOSFET. The set of inverters are coupled in series in a feedback loop between the output and a first input of the differential amplifier. The MOSFET has a gate, a gate oxide, a source and a drain arranged in a gate—gate oxide-source/drain structure. The gate oxide of the MOSFET is subjected to time dependent dielectric breakdown during a normal operating mode (e.g., when the ring oscillator module is disabled). The gate—gate oxide-source/drain structure is coupled as a first gate leakage source to the first input of the differential amplifier during a test mode (e.g., when the ring oscillator module is enabled).

Embodiments of the present invention advantageously provide a system and method of measuring time dependent dielectric breakdown utilizing ring oscillators. The age of an associated integrated circuit, electronic device or the like may advantageously be extrapolated from the measurement of the time dependent dielectric breakdown. The measurement of time dependent dielectric breakdown may also advantageously be utilized to adjust the trade-off between device performance and lifetime.

BRIEF DESCRIPTION OF THE DRAWINGS

Embodiments of the present invention are illustrated by way of example and not by way of limitation, in the figures of the accompanying drawings and in which like reference numerals refer to similar elements and in which:

FIGS. 2A and 2B show a block diagram of exemplary implementation of a system for measuring time dependent dielectric breakdown (TDDB), in accordance with one embodiment of the present invention.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
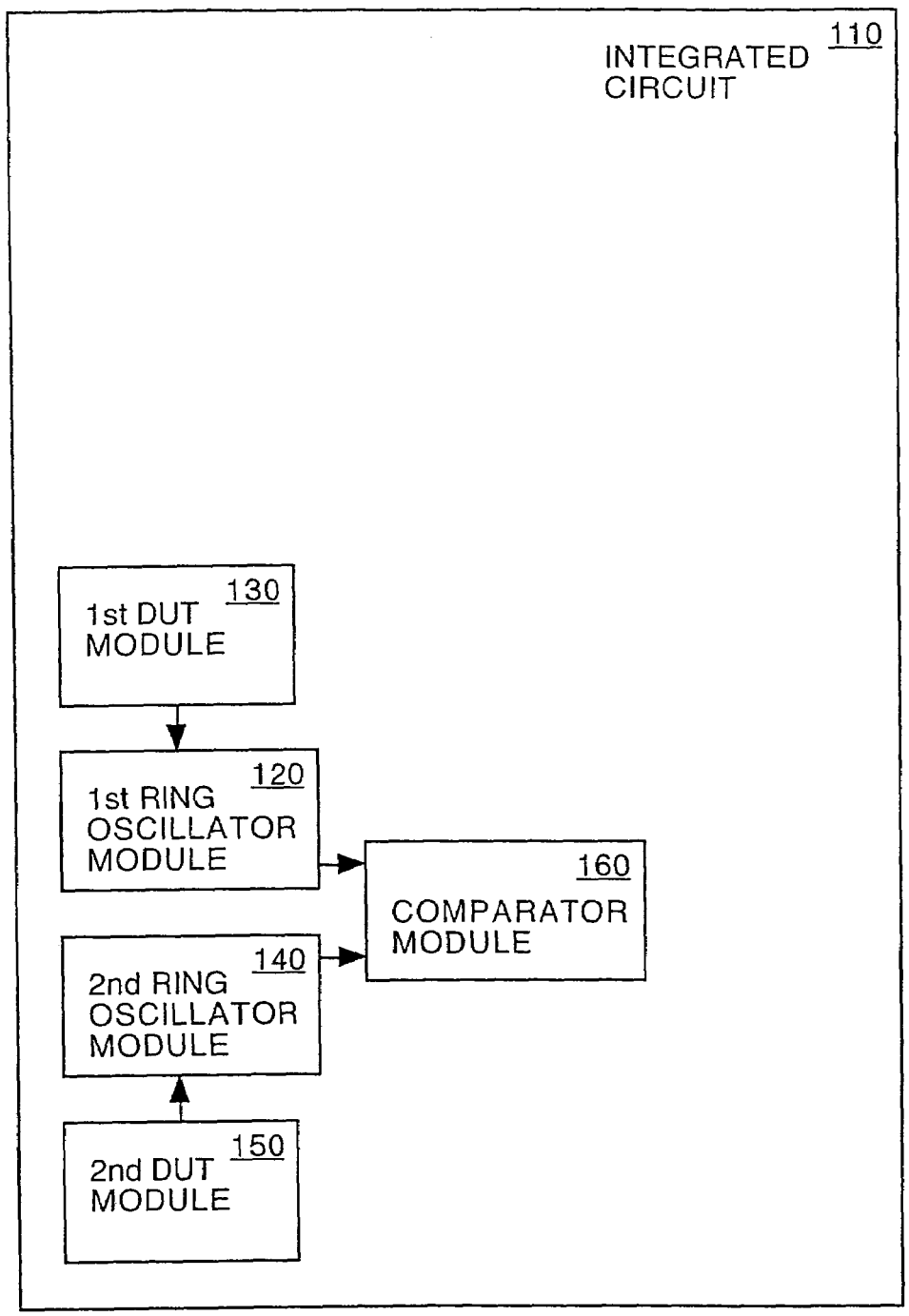
FIG. 1 shows a block diagram of a system for measuring time dependent dielectric breakdown (TDDB) in an integrated circuit, in accordance with one embodiment of the present invention.

Referring to FIG. 1, a block diagram of a system for measuring time dependent dielectric breakdown (TDDB) in an integrated circuit 110, in accordance with one embodiment of the present invention, is shown. As depicted in FIG. 1, the system for measuring TDDB includes a first ring oscillator module 120, a first device under test (DUT) module 130, a second ring oscillator module 140, a second DUT module 150 and a comparator module 160. The first DUT module 130 may be coupled to the first ring oscillator module 120. The second DUT module 150 may be coupled to the second ring oscillator module 140. The comparator module 160 may be coupled to the first and second ring oscillator modules 120, 140, such that the operating frequencies of the first and second ring oscillator modules 120, 140 may be compared.

In a first mode (e.g., normal operating mode), the first and second ring oscillator modules 120, 140 are disabled, such that corresponding oscillator signals are not generated. During the first state, the first DUT module 130 (e.g., stressed module) may be biased such that a dielectric layer (e.g., gate oxide of a metal-oxide-semiconductor field effect transistor) may be stressed. The stressing of the dielectric layer of the first DUT module 130 causes time dependent dielectric breakdown (TDDB). The second DUT module 150 (e.g., reference module) may be biased such that a gate insulator is not stressed. The dielectric layer of the second DUT module 150 does not suffer from TDDB in the absence of stress over a prolonged period of time. It is appreciated that TDDB results in an increase in the leakage current across the dielectric layer of the first DUT module 130. Thus, for a fixed voltage applied to the DUT modules 130, 150, the leakage current will increase for the first DUT module 130 over time. The leakage current of the second DUT module 150 will remain substantially constant.

In a second mode (e.g., test mode), the first and second ring oscillator modules 120, 140 are enabled. Thus, each ring oscillator module 120, 140 generates a periodic signal having a frequency that is a function of the gate leakage current provided by the respective DUT module 130, 150. More specifically, the first ring oscillator module 120 generates an oscillator signal having a first operating frequency that is a function of the gate leakage current provided by the first DUT module 130. As described above, the gate leakage current provided by the first DUT module 130 will increase over time during the normal operating mode. Thus, the operating frequency of the first ring oscillator module 120 will increase over time. The second ring oscillator module 140 generates an oscillator signal having a second operating frequency that is a function of the gate leakage current provided by the second DUT module 150. As described above, the gate leakage current provided by the second DUT module 150 will remain substantially constant over time. Thus, the operating frequency of the second ring oscillator module 140 will remain substantially constant over time.

During the second mode, the comparator module 160 compares the operating frequencies of the first and second ring oscillator modules 120, 140. Various embodiments of the comparator module 160 are described in the following disclosures: U.S. Pat. No. 6,903,564, filed Nov. 12, 2003, by Shingo Suzuki, entitled "A device Age Determination circuit," U.S. Pat. No. 6,885,210, filed Sep. 26, 2003, by Shingo Suzuki, entitled "System and Method for Measuring Transistor Leakage Current with a Ring Oscillator with Backbias Controls," and U.S. Pat. No. 6,882,172, filed Apr. 16, 2002, by Shingo Suzuki et al., entitled "A System and Method for Measuring Transistor Leakage Current with a Ring Oscillator," which are incorporated herein by reference. In one implementation, the comparator module 160 generates an output signal that is a function of the difference between the first operating frequency and the second operating frequency. The signal is indicative of the extent of the TDDB in the first DUT module 130. TDDB increases as the integrated circuit 110 operates over time. Thus, it is appreciated that the age of the integrated circuit 110 may be extrapolated from the output signal generated by the comparator module 160.

It is also appreciated that the first and second operating frequencies may not be equal at an initial time (e.g., when the integrated circuit is powered up for the first time) due to process variations in manufacturing the integrated circuit 110. Accordingly, an initial measurement of the difference between the first and second operating frequencies may be made and stored as an offset for extrapolating the age of the integrated circuit 110. The offset value may be stored in a non-volatile storage module (not shown), such as a set of fuses, static memory (e.g., static ROM, static RAM, flash memory, etc.), and the like, internal or external to the integrated circuit 110.

It is appreciated that the comparator module 160 is an optional element of the system for measuring TDDB. The comparator module 160 may alternatively be implemented by core circuitry of the integrated circuit 110. The function of the comparator module 160 may also be implemented external to the integrated circuit 110. Although embodiments of the present invention are described as being included in an integrated circuit 110, it is appreciated that the system for measuring TDDB may be utilized in conjunction with various other electronic devices.

Figure 2C:
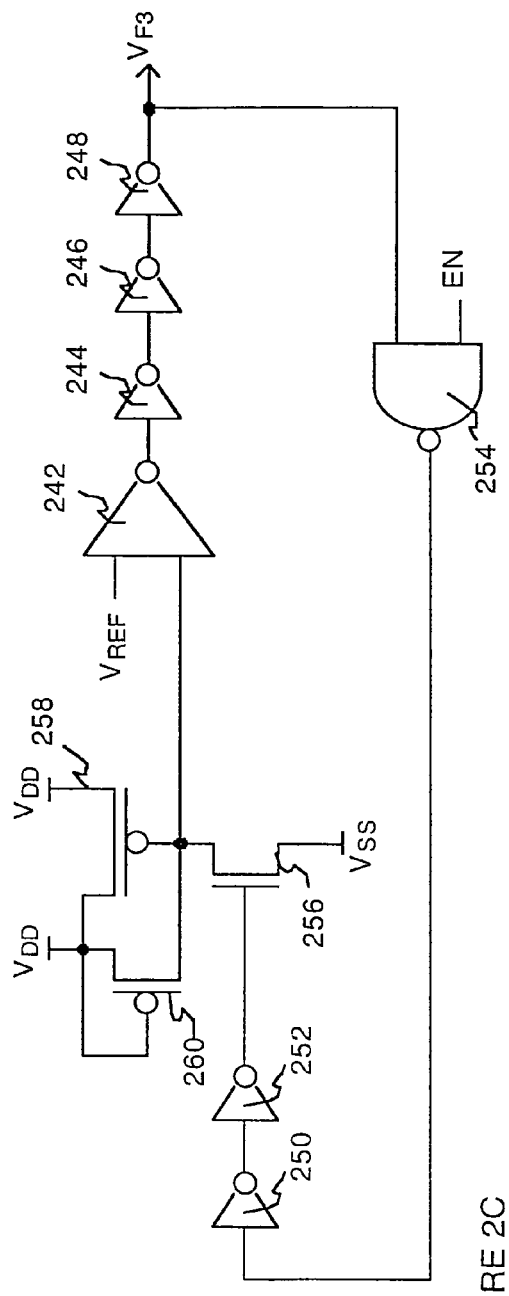
FIGS. 2C and 2D show a block diagram of exemplary implementation of a system for measuring time dependent dielectric breakdown (TDDB), in accordance with another embodiment of the present invention.

Referring now to FIGS. 2A, 2B, 2C and 2D, block diagrams of exemplary implementations of a system for measuring time dependent dielectric breakdown (TDDB), in accordance with one embodiment of the present invention, is shown. As depicted in FIGS. 2A and 2B, the system for measuring TDDB in an n-channel metal-oxide-semiconductor field effect transistor (N-MOSFET) includes a first ring oscillator module 120, a first DUT module 130, a second ring oscillator module 140 and a second DUT module 150.

The first ring oscillator module 120 includes a first differential amplifier 202 and a first set of inverters 204–212. The first set of inverters 204–212 includes an odd number of inverters. The first set of inverter stages 204–212 are coupled in series with each other and form a feedback loop from an output of the first differential amplifier 202 to an input of the first differential amplifier 202. The first ring oscillator 120 may also include a first NAND gate 214 having a first input and an output coupled in series with the first set of inverters 204–212. A second input of the first NAND gate 214 may be coupled to an enable signal (EN). The first DUT module 130 includes a first p-channel metal-oxide-semiconductor field effect transistor (P-MOSFET) 216, a first N-MOSFET 218 and a second N-MOSFET 220.

The first P-MOSFET 216 includes a gate coupled to an output of one of the inverters 212 and a source coupled to a first potential ($V_{DD}$) (e.g., supply voltage). The first N-MOSFET 218 includes a source and drain coupled to a second potential ($V_{SS}$) (e.g., ground). The second N-MOSFET 220 includes a source and gate coupled to the second potential ($V_{SS}$) and a drain coupled to a gate of the first N-MOSFET 218 and the drain of the first P-MOSFET 216. The drain of the second N-MOSFET 220, the gate of the first N-MOSFET 218 and the drain of the first P-MOSFET 216 are coupled to a first input of the first differential amplifier 202. A second input of the first differential amplifier 202 is coupled to a reference voltage ($V_{REF}$).

The second ring oscillator module 140 includes a second differential amplifier 222 and a second set of inverters 224–232. The second set of inverters 224–232 includes an odd number of inverters. The second set of inverter stages 254–262 are coupled in series with each other and form a feedback loop from an output of the second differential amplifier 222 to an input of the second differential amplifier 222. The second ring oscillator module 140 may also include a second NAND gate 234 having a first input and an output connected in series with the inverters 224–232. The second input of the second NAND gate 234 is coupled to the enable signal (EN). The second DUT module 150 includes a second P-MOSFET 236, a third N-MOSFET 238 and a fourth N-MOSFET 240. The second P-MOSFET 236 includes a gate coupled to an output of one of the inverters 232 and a source coupled to the first potential ($V_{DD}$). The third N-MOSFET 238 includes a source and drain coupled to the second potential ($V_{SS}$). The fourth N-MOSFET 240 includes a source coupled to the second potential ($V_{SS}$), a gate coupled to a complement of the enable signal (EN'), and a drain coupled to a gate of the third N-MOSFET 238 and the drain of the second P-MOSFET 236. The drain of the second P-MOSFET 236, the gate of the third N-MOSFET 238 and the drain of the fourth N-MOSFET 240 are coupled to a first input of the second differential amplifier 222. A second input of the second differential amplifier 222 is coupled to the reference voltage ($V_{REF}$).

In a first mode (e.g., normal operating mode), the first ring oscillator module 120 does not generate a first oscillator signal ($V_{F1}$). More specifically, a low state enable signal (EN) is received at a first input of the first NAND gate 214. When the first input of the first NAND gate 214 is low, the output of the first NAND gate 214 is high regardless of the state of the second input of the first NAND gate 214. When the output of the first NAND gate 214 is high, the gate of the first P-MOSFET 216 is low, and therefore, the potential at the gate of the first N-MOSFET 218 (e.g., stressed N-MOSFET) is substantially equal the first potential ($V_{DD}$). The potential at the source and drain of the first N-MOSFET 218 (e.g., stressed N-MOSFET) is at the level of the second potential ($V_{SS}$). The gate and source of the second N-MOSFET 220 are substantially at the level of the second potential ($V_{SS}$) and therefore, the second N-MOSFET 220 is turned off (e.g., does not conduct between its source and drain). Accordingly, the first N-MOSFET 218 is biased such that the gate oxide of the first N-MOSFET 218 is stressed.

In the first mode, the second ring oscillator module 140 does not generate a first oscillator signal ($V_{F2}$). More specifically, a low state enable signal (EN) is received at a first input of the second NAND gate 234. When the first input of the second NAND gate 234 is low, the output of the second NAND gate 234 is high regardless of the state of the first input of the second NAND gate 234. When the output of the second NAND gate 234 is high, the gate of the second P-MOSFET 236 is high, and therefore, second P-MOSFET 236 does not conduct (e.g., high impedance) between its source and drain. The gate of the fourth N-MOSFET 240 receives the complement of the enable signal (EN') (e.g., a high state) and the source is substantially at the level of the second potential ($V_{SS}$). Thus, the fourth N-MOSFET 240 is turned on and biases the gate of the third N-MOSFET 238 (e.g., reference N-MOSFET) substantially at the level of the second potential ($V_{SS}$). The potential at the source and drain of the third N-MOSFET 238 (e.g., reference N-MOS) is also at the level of the second potential ($V_{SS}$). Accordingly, the third N-MOSFET 238 is biased such that the gate oxide of the third N-MOSFET 238 is not stressed (e.g., reference).

It is appreciated that the period of time of operating in the normal operating mode may be substantially equal to the period of time that an associated integrated circuit, electronic device or the like, is operating. Accordingly, the first N-MOSFET 218 ages at substantially the same rate as N-MOSFET device utilized in the integrated circuit, electronic device, or the like. Alternatively, the first N-MOSFET 218 may represent the worst case of the integrated circuit for a conservative lifetime estimation. However, the third N-MOSFET 238 is not stressed and therefore does not age an appreciable amount during normal operating mode.

In a second mode (e.g., test mode), the first N-MOSFET 218 is biased such that the gate—gate oxide-source/drain structure of the first N-MOSFET 218 acts as a gate leakage current source coupled to the first input of the first differential amplifier 202. The first NAND gate 214 receives a high state enable signal (EN) on its first input, which results in the first ring oscillator module 120 generating a first oscillator signal ($V_{F1}$). The operating frequency of the first oscillator signal ($V_{F1}$) will be a function of the gate-to-source/drain leakage current of the first N-MOSFET 218. It is appreciated, from the above-description of the normal operating mode, that the first N-MOSFET 218 is stressed resulting in TDDB that will cause an increase in the gate leakage current of the first N-MOSFET 218. Accordingly, the operating frequency of the first oscillator signal ($V_{F1}$) will increase over time.

In the second mode, the third N-MOSFET 238 is biased such that the gate—gate oxide-source/drain structure of the third N-MOSFET 238 acts as a gate leakage current source coupled to the input of the second differential amplifier 222. The second NAND gate 234 receives a high state enable signal (EN), which results in the second ring oscillator module 140 generating a second oscillator signal ($V_{F2}$). The operating frequency of the second oscillator signal ($V_{F2}$) will be a function of the gate-to-source/drain leakage current of the third N-MOSFET 238. It is appreciated, from the above-description of the normal operating mode, that the third N-MOSFET 238 is not stressed and therefore, the gate-to-source/drain leakage current of the third N-MOSFET 238 remains substantially constant. Accordingly, the operating frequency of the second oscillator signal ($V_{F2}$) will remain substantially constant over time.

It is appreciated that the period of time of the test mode should be negligible compared to the normal operating mode. It is also appreciated that the operating frequency of the first and second oscillator signals ($V_{F1}$, $V_{F2}$) may be measured at any node in the respective first and second rings oscillator modules 120, 140. The difference between the operating frequency of the first and second oscillator signals ($V_{F1}$, $V_{F2}$) is an indication of the age of the first and third N-MOSFET 218, 238. Thus, the age of the integrated circuit, electronic device or the like, which is implemented utilizing N-MOSFETs, may also be estimated.

Figure 2D:
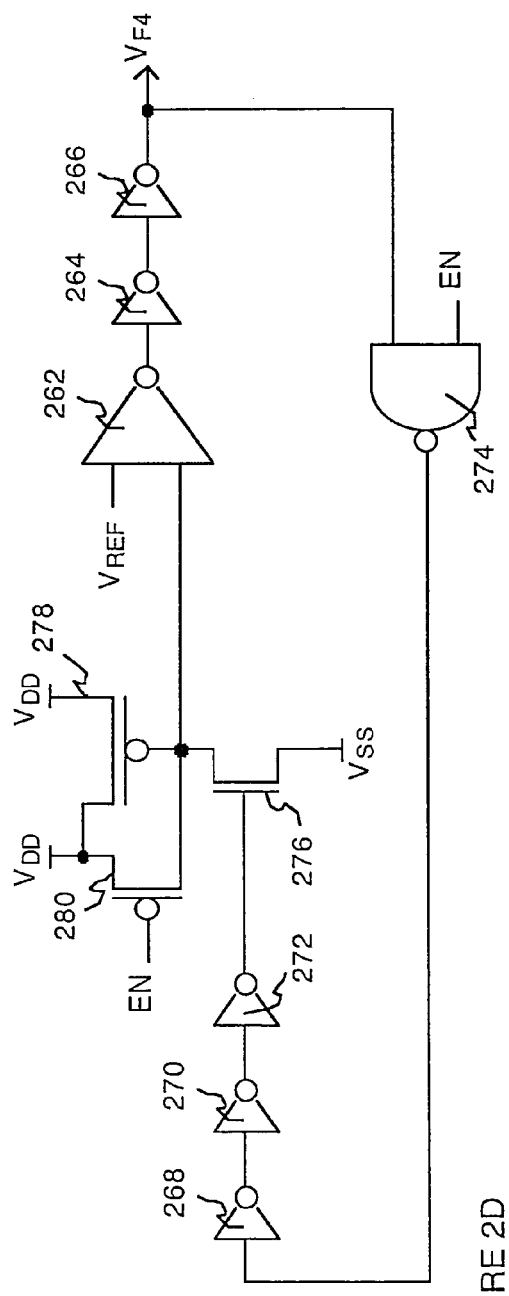

As depicted in FIGS. 2C and 2D, a system for measuring TDDB in a p-channel metal-oxide-semiconductor field effect transistor (P-MOSFET) includes a third ring oscillator module, a third DUT module, a fourth ring oscillator module and a fourth DUT module. The third ring oscillator module includes a third differential amplifier 242 and a third set of inverters 244–252. The third set of inverters 244–252 includes an odd number of inverters. The third set of inverters 244–252 are coupled in series with each other and form a feedback loop from the output of the third differential amplifier 242 to an input of the third differential amplifier 242. The third ring oscillator may also include a third NAND gate 254 having a first input and an output coupled in series with the third set of inverters 244–252. A second input of the third NAND gate 254 is coupled to an enable signal (EN).

The third DUT module includes a fifth N-MOSFET 256, a third P-MOSFET 258 and a fourth P-MOSFET 260. The fifth N-MOSFET 256 includes a gate coupled to an output of one of the inverters 252 and a source coupled to the second potential ($V_{SS}$). The third P-MOSFET 258 includes a source and drain coupled to the first potential ($V_{DD}$). The fourth P-MOSFET 260 includes a source and gate coupled to the first potential ($V_{DD}$) and a drain coupled to a gate of the third P-MOSFET 258 and the drain of the fifth N-MOSFET 256. The drain of the fourth P-MOSFET 260, the gate of the third P-MOSFET 258 and the drain of the fifth N-MOSFET 256 are coupled to a first input of the third differential amplifier 242. A second input of the third differential amplifier 242 is coupled to the reference voltage ($V_{REF}$).

The fourth ring oscillator module includes a fourth differential amplifier 262 and a fourth set of inverters 264–272. The fourth set of inverters 264–272 includes an odd number of inverters. The fourth set of inverters 264–272 are coupled in series with each other and form a feedback loop from the output of the fourth differential amplifier 262 to an input of the fourth differential amplifier 262. The fourth ring oscillator may also include a fourth NAND gate 274 having a first input and an output coupled in series with the fourth set of inverters 264–272. The second input of the fourth NAND gate 274 is coupled to the enable signal (EN).

The fourth DUT module includes a sixth N-MOSFET 276, a fifth P-MOSFET 278 and a sixth P-MOSFET 280. The sixth N-MOSFET 276 includes a gate coupled to an output of one of the inverters 272 and a source coupled to the second potential ($V_{SS}$). The fifth P-MOSFET 278 includes a source and drain coupled to the first potential ($V_{DD}$). The sixth P-MOSFET 280 includes a source coupled to the first potential ($V_{DD}$), a gate coupled to the enable signal (EN), and a drain coupled to a gate of the fifth P-MOSFET 278 and the drain of the sixth N-MOSFET 276. The drain of the sixth N-MOSFET 276, the gate of the fifth P-MOSFET 278 and the drain of the sixth P-MOSFET 280 are coupled to a first input of the fourth differential amplifier 262. A second input of the fourth differential amplifier 262 is coupled to the reference voltage ($V_{REF}$).

In a first mode (e.g., normal operating mode), the third ring oscillator module does not generate a third oscillator signal ($V_{F3}$). More specifically, a low state enable signal (EN) is received at a first input of the third NAND gate 254. When the first input of the third NAND gate 254 is low, the output of the third NAND gate 254 is high regardless of the state of the second input of the third NAND gate 254. When the output of the third NAND gate 254 is high, the gate of the fifth N-MOSFET 256 is high and therefore, the potential at the gate of the third P-MOSFET 258 (e.g., stressed P-MOSFET) is substantially equal the second potential ($V_{SS}$). The potential at the source and drain of the third P-MOSFET 258 (e.g., stressed P-MOSFET) is at the level of the first potential ($V_{DD}$). The gate and source of the fourth P-MOSFET 260 are substantially at the level of the first potential ($V_{DD}$) and therefore, the fourth P-MOSFET 260 is turned off (e.g., does not conduct between its source and drain). Accordingly, the third P-MOSFET 258 (e.g., stressed P-MOSFET) is biased such that the gate oxide of the third P-MOSFET 258 is stressed.

In the first mode, the fourth ring oscillator does not generate a fourth oscillator signal ($V_{F4}$). More specifically, a low state enable signal (EN) is received at a first input of the fourth NAND gate 274. When the first input of the fourth NAND gate 274 is low, the output of the fourth NAND gate 274 is high regardless of the state of the second input of the fourth NAND gate 274. When the output of the fourth NAND gate 274 is high, the gate of the sixth N-MOSFET 276 is low and therefore sixth N-MOSFET 276 does not conduct (e.g., high impedance) between its source and drain. The gate of the sixth P-MOSFET 280 receives the enable signal (EN) (e.g., low state), and therefore, the source is substantially at the level of the first potential ($V_{DD}$). Thus, the sixth P-MOSFET 280 is turned on and biases the gate of the fifth P-MOSFET 278 (e.g., reference P-MOSFET) substantially at the level of the first potential ($V_{DD}$). The potential at the source and drain of the fifth P-MOSFET 278 (e.g., reference P-MOSFET) is at the level of the first potential ($V_{DD}$). Accordingly, the fifth P-MOSFET 278 is biased such that the gate oxide of the fifth P-MOSFET 278 is not stressed.

It is appreciated that the period of time of operating in the normal operating mode may be substantially equal to the period of time that an associated integrated circuit, electronic device or the like, is operating. Accordingly, the third P-MOSFET 258 ages at substantially the same rate as P-MOSFET device utilized in the integrated circuit, electronic device, or the like. Alternatively, the first N-MOSFET 218 may represent the worst case of the integrated circuit for a conservative lifetime estimation. However, the fifth P-MOSFET 278 is not stressed, and therefore, does not age an appreciable amount during the normal operating mode.

In the second mode (e.g., test mode), the third P-MOSFET 258 is biased such that the gate—gate oxide-source/drain structure of the third P-MOSFET 258 acts as a gate leakage current source coupled to the first input of the third differential amplifier 242. The third NAND gate 254 receives a high state enable signal (EN) on its first input, which results in the third ring oscillator module generating a third oscillator signal ($V_{F3}$). The operating frequency of the third oscillator signal ($V_{F3}$) is a function of the gate-to-source/drain leakage current of the third P-MOSFET 258. It is appreciated that the third P-MOSFET 258 is stressed during the normal operating mode, thereby resulting in TDDB that will cause an increase in the gate leakage current of the third P-MOSFET 258. Accordingly, the operating frequency of the third oscillator signal ($V_{F3}$) will increase over time.

In the second mode, the fifth P-MOSFET 278 is biased such that the gate—gate oxide-source/drain structure of the fifth P-MOSFET 278 acts as a gate leakage current source coupled to the first input of the fourth differential amplifier 272. The fourth NAND gate 274 receives a high state of the enable signal (EN) on its first input, which results in the fourth ring oscillator module generating a fourth oscillator signal ($V_{F4}$). The operating frequency of the fourth oscillator signal ($V_{F4}$) will be a function of the gate-to-source/drain leakage current of the fifth P-MOSFET 278. It is appreciated that the fifth P-MOSFET 278 is not stressed, and therefore, the gate-to-source/drain leakage current of the fifth P-MOSFET 278 remains substantially constant. Accordingly, the operating frequency of the fourth oscillator signal ($V_{F4}$) will remain substantially constant over time.

The difference between the operating frequency of the third and fourth oscillator signals ($V_{F3}$, $V_{F4}$) is an indication of the age of the third P-MOSFET. Thus, the age of the integrated circuit, electronic device or the like, which is implemented utilizing P-MOSFETs may also be estimated. It is appreciated that the period of time of the test mode should be negligible compared to the normal operating mode. To determine the age of the integrated circuit, electronic device, or the like, the test mode may be initiated periodically or in response to a measurement request. It is also appreciated that the operating frequency of the third and fourth oscillator signals ($V_{F3}$, $V_{F4}$) may be measure at any node in the respective third and fourth rings oscillator modules.

The system for measuring TDDB in N-MOSFETs, as depicted in FIGS. 2A and 2B, and the system for measuring TDDB in P-MOSFETs, as depicted in FIGS. 2C and 2D, may be combined to measure TDDB in integrated circuits, electronic device or the like that are implemented utilizing N-MOSFETs and P-MOSFETs (e.g., CMOS circuits).

It is also appreciated that the difference between the operating frequencies of the plurality of ring oscillator modules (e.g., age of the device) may be utilized to adjust the trade-off between device performance and lifetime. The trade-off between device performance and lifetime may be adjusted by adjusting various parameters, such as supply voltage level, operating frequency, back bias (e.g., threshold voltage), operating temperature, and/or the like in response to the difference between the operating frequency of the first and second ring oscillator modules 120, 140 (e.g., age of the device).

Figure 3:
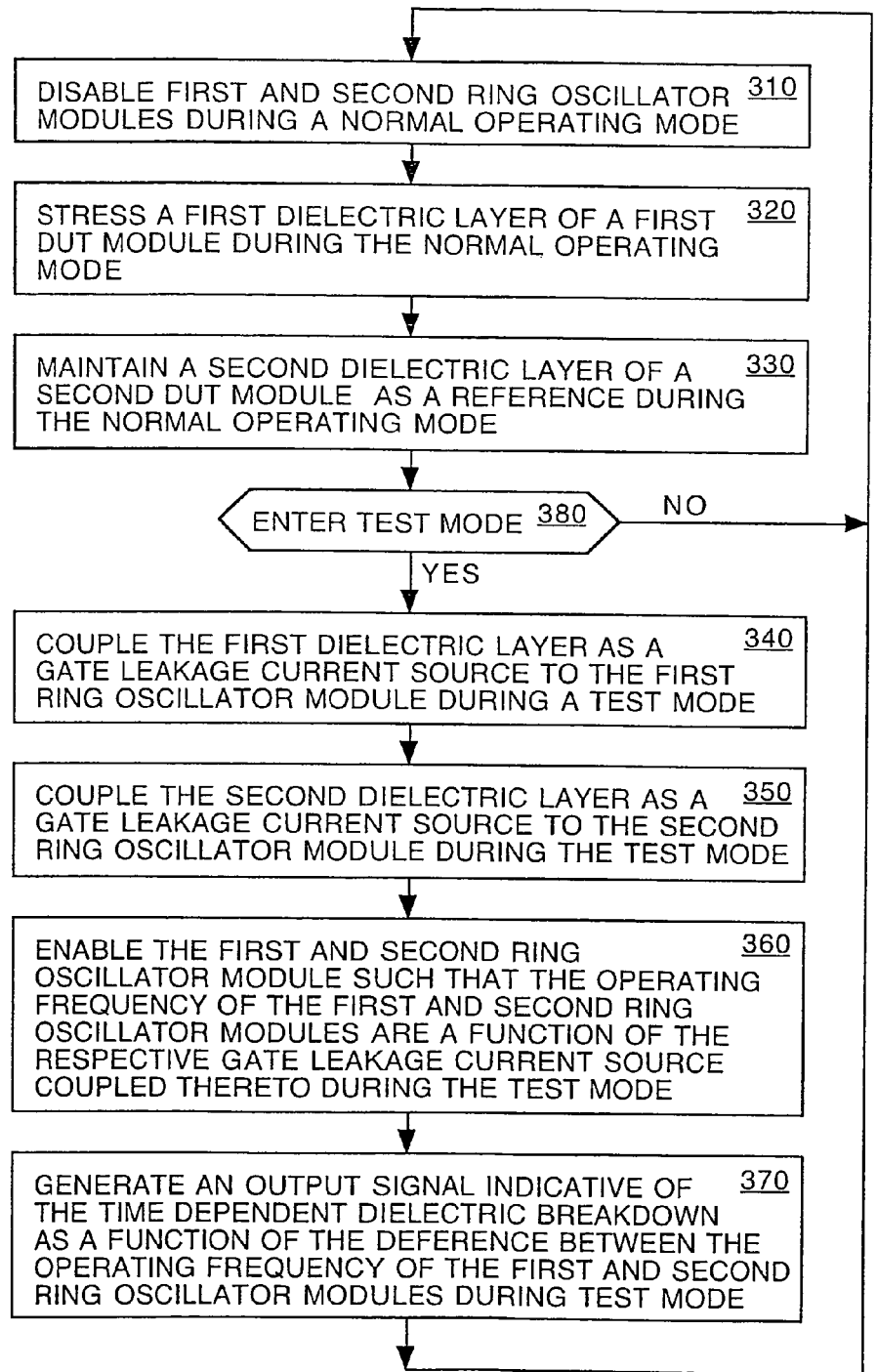
FIG. 3 shows a flow diagram of steps of a method of measuring time dependent dielectric breakdown (TDDB), in accordance with one embodiment of the present invention.

Referring now to FIG. 3, a flow diagram of steps of a method of measuring time dependent dielectric breakdown (TDDB), in accordance with one embodiment of the present invention, is shown. As depicted in FIG. 3, the method of measuring TDDB includes a normal operating mode and a test mode. In the normal operating mode, first and second ring oscillator modules may be disabled, at 310. In one implementation, a first and second NAND gates, of the respective first and second ring oscillator modules, receive an enable signal at a respective first input. A respective second input and a respective output of the NAND gates are coupled in series in a feedback loop of the respective ring oscillator modules. In the normal operating mode, the enable signal is at a first state (e.g., low voltage level) and therefore the output of each of the NAND gates are at a second state (e.g., high voltage level). When the outputs of the NAND gates are held at the second state, the first and second ring oscillator modules do not generate oscillator signals.

At 320, a first dielectric layer of a first DUT module, coupled to the first ring oscillator module, may be stressed during the normal operating mode. Stressing the first dielectric layer results in time dependent dielectric breakdown, which increases a gate leakage current associated with the first dielectric layer. In one implementation, a voltage potential is applied across a gate oxide layer of a first MOSFET. In a first example, a source voltage level is applied to a gate of a first N-MOSFET device and the source and drain are grounded. In a second example, a gate of a first P-MOSFET device is grounded and a source voltage level is applied to the source and drain.

At 330, a second dielectric layer of a second DUT module, coupled to the second ring oscillator module, may be maintained as a reference during the normal operating mode. The gate leakage current associated with the second dielectric layer remains substantially constant in the absence of stress. In one implementation, a voltage potential is not applied across a gate oxide layer of a second MOSFET. In the first example, the gate, source and drain of a second N-MOSFET device are grounded. In the second example, the source voltage is applied to the gate, source and drain of a second P-MOSFET device.

At 340, the first dielectric layer of the first DUT module may be coupled as a gate leakage current source to the first ring oscillator during the test mode. In one implementation, the first MOSFET is coupled in the feedback loop of the first ring oscillator module. In a first example, the gate of a first N-MOSFET device is coupled to the feedback loop and the source and drain are grounded. In the second example, the gate of a first P-MOSFET device is coupled to the feedback loop and the source and drain are coupled to the supply voltage.

At 350, the second dielectric layer of the second DUT module may be coupled as a gate leakage current source to the second ring oscillator, during the test mode. In one implementation, the second MOSFET is coupled in the feedback loop of the second ring oscillator module. In the first example, the gate of the second N-MOSFET device is coupled to the feedback loop and the source and drain are grounded. In the second example, the gate of the second P-MOSFET device is coupled to the feedback loop and the source and drain are coupled to the supply voltage.

At 360, the first and second ring oscillator modules may be enabled during the test mode. The operating frequencies of the first and second ring oscillator modules are each a function of the respective gate leakage current coupled to the ring oscillator modules. In one implementation, the enable signal is switched to a second state (e.g., high voltage level) and therefore the output of each of the NAND gates are at the first state (e.g., low voltage level). When the output of the NAND gates are held at the first state, the first and second ring oscillator modules generate oscillator signals having operating frequency that are a function of the respective gate leakage current source.

At 370, the operating frequencies of the first and second ring oscillator modules may be compared during the test mode. A signal indicative of the effect of TDDB may be generated as a result of the comparison. It is appreciated that the age of an integrated circuit may then be extrapolated from the result of the comparison.

The test mode may be entered upon one or more conditions, at 380. In one implementation, the test mode may be initiated periodically or in response to a measurement request. It is appreciated that the period of time of the test mode should be negligible compared to the normal operating mode.

Accordingly, embodiments of the present invention provide a system and method of measuring time dependent dielectric breakdown utilizing ring oscillators. The age of an associated integrated circuit, electronic device or the like may advantageously be extrapolated from the measurement of the time dependent dielectric breakdown. The measurement of time dependent dielectric breakdown may also advantageously be utilized to adjust the trade-off between device performance and lifetime.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system for measuring time dependent dielectric breakdown comprising:
   a first differential amplifier having a first input coupled to a reference voltage;
   a first set of inverters coupled in series in a feedback loop between an output of said first differential amplifier and a second input of said first differential amplifier; and
   a first MOSFET having a gate, a gate oxide, a source and a drain arranged in a gate—gate oxide-source/drain structure, wherein said gate oxide is subjected to time dependent dielectric breakdown during a normal operating mode and wherein said gate—gate oxide-source/drain structure is coupled as a first gate leakage current source to said second input of said first differential amplifier during a test mode.

2. The system of claim 1, further comprising a NAND gate having a first input coupled to an enable signal and having a second input and an output coupled in series in said feedback loop.

3. The system of claim 1, further comprising:
   a second differential amplifier having a first input coupled to said reference voltage;
   a second set of inverters coupled in series in a feedback loop between an output of said differential amplifier and a second input of said second differential amplifier; and
   a second MOSFET having a gate, a gate oxide, a source and a drain arranged in a gate—gate oxide-source/drain structure, wherein said gate oxide is not subjected to time dependent dielectric breakdown during said normal operating mode and wherein said gate—gate oxide-source/drain structure is coupled as a second gate leakage current source to said second input of said second differential amplifier during a test mode.

4. The system of claim 3, wherein said first MOSFET and said second MOSFET are n-channel MOSFETs.

5. The system of claim 3, wherein said first MOSFET and said second MOSFET are p-channel MOSFETs.

6. The system of claim 3, further comprising:
   a third differential amplifier having a first input coupled to said reference voltage;
   a third set of inverters coupled in series in a feedback loop between an output of said third differential amplifier and a second input of said third differential amplifier;
   a third MOSFET having a gate, a gate oxide, a source and a drain arranged in a gate—gate oxide-source/drain structure, wherein said gate oxide is subjected to time dependent dielectric breakdown during said normal operating mode and wherein said gate—gate oxide-source/drain structure is coupled as a third gate leakage current source to said second input of said third differential amplifier during said test mode;
   a fourth differential amplifier having a first input coupled to said reference voltage;
   a fourth set of inverters coupled in series in a feedback loop between an output of said fourth differential amplifier and a second input of said fourth differential amplifier; and
   a fourth MOSFET having a gate, a gate oxide, a source and a drain arranged in a gate—gate oxide-source/drain structure, wherein said gate oxide is not subjected to time dependent dielectric breakdown during said normal operating mode and wherein said gate—gate oxide-source/drain structure is coupled as a fourth gate leakage current source to said second input of said fourth differential amplifier during said test mode.

7. The system of claim 6, wherein:
   said first MOSFET and said second MOSFET are n-channel MOSFETs; and
   said third MOSFET and said fourth MOSFET are p-channel MOSFETs.

* * * * *